(12) United States Patent
Wang et al.

(10) Patent No.: US 8,525,524 B2
(45) Date of Patent: Sep. 3, 2013

(54) MULTI-TRACK DETECTION SYSTEM FOR DETECTING THE APPEARANCE OF ELECTRONIC ELEMENTS

(75) Inventors: Bily Wang, Hsin Chu (TW); Kuei-Pao Chen, Hsin Chu (TW); Hsin-Cheng Chen, Hsinchu County (TW); Ren-Chun Ni, Miaoli County (TW)

(73) Assignee: Youngtek Electronics Corporation, Hsinchu (TW)

( * ) Notice: Subject to any disclaimer, the term of this patent is extended or adjusted under 35 U.S.C. 154(b) by 256 days.

(21) Appl. No.: 13/169,086

(22) Filed: Jun. 27, 2011

(65) Prior Publication Data

US 2012/0249156 A1  Oct. 4, 2012

(30) Foreign Application Priority Data

Mar. 28, 2011 (TW) .............................. 100110563 A

(51) Int. Cl.
*G01R 31/02* (2006.01)
(52) U.S. Cl.
USPC ..................... 324/537; 324/76.11; 73/115.01; 73/118.02
(58) Field of Classification Search
USPC .............. 73/115.01, 118.02; 324/537, 76.11
See application file for complete search history.

(56) References Cited

U.S. PATENT DOCUMENTS

| 4,529,986 | A | * | 7/1985 | d'Auria et al. ................. 342/433 |
| 2011/0210724 | A1 | * | 9/2011 | Goldfine et al. .............. 324/239 |
| 2011/0260734 | A1 | * | 10/2011 | Liao et al. ..................... 324/537 |

* cited by examiner

*Primary Examiner* — Jermele M Hollington
*Assistant Examiner* — Temilade S Rhodes-Vivour
(74) *Attorney, Agent, or Firm* — Li & Cai Intellectual Property (USA) Office

(57) ABSTRACT

A multi-track detection system for detecting the appearance of electronic elements includes a rotary module, a feeding module, an unvibrated module, a detection module, and a classification module. The rotary module includes a hollow transparent rotary structure having at least two annular guiding areas on the top surface thereof, and the electronic elements are sequentially arranged on the two annular guiding area. The feeding module has two V-shaped feeding grooves for guiding the electronic elements. The unvibrated module includes an unvibrated guiding block having two V-shaped unvibrated guiding grooves respectively communicated with the two V-shaped feeding grooves and respectively corresponding to the two annular guiding areas. The electronic elements on the V-shaped feeding grooves are sequentially transmitted onto the two annular guiding areas through two V-shaped unvibrated guiding grooves, thus each electronic element can be detected by the detection module and classified by the classification module, respectively.

18 Claims, 7 Drawing Sheets

MULTI-TRACK DETECTION SYSTEM FOR DETECTING THE APPEARANCE OF ELECTRONIC ELEMENTS

BACKGROUND OF THE INVENTION

1. Field of the Invention

The instant disclosure relates to a multi-track detection system, and more particularly, to a multi-track detection system for detecting the appearance of electronic elements.

2. Description of Related Art

Mobile communication and electronic devices have been developed to be multi-functional, miniaturized, highly reliable and low cost. Therefore, different functions of circuit designs are integrated onto increasingly smaller chip size. For example, mobile phones with only voice communication function are out of date and newly designed phones commonly have many accessory functions, such that people can record important matters in the phone, transfer a text message to a friend or watch digital TV programs on the phone.

Thus, with the increasing variety and sophistication of electronic devices, the quality and the reliability of the electronic components are crucial to the performance of the electronic devices. Generally, it is necessary for the components to be tested when the manufacturing procedure is finished. In the traditional inspection method, all the components are disposed on a large-area disk and many cameras are used for capturing the images of the surface appearances of the components. For inspecting the bottom surface of each component, the large-area disk has to be transparent.

SUMMARY OF THE INVENTION

One particular aspect of the instant disclosure is to provide a multi-track detection system for detecting the appearance of electronic elements.

One of the embodiments of the instant disclosure provides a multi-track detection system for detecting the appearance of electronic elements, comprising: a rotary module, a feeding module, an unvibrated module, a detection module, and a classification module. The rotary module includes a rotary base structure and a hollow transparent rotary structure disposed on the rotary base structure. The hollow transparent rotary structure has a bottom surface divided into an inner loop area and an outer loop area around the inner loop area, the inner loop area of the hollow transparent rotary structure is covered by the rotary base structure, the outer loop area of the hollow transparent rotary structure is exposed, the hollow transparent rotary structure has at least two annular guiding areas on the top surface thereof and above the outer loop area, and the electronic elements are sequentially arranged on the at least two annular guiding areas. The feeding module includes at least one feeding unit adjacent to the hollow transparent rotary structure, wherein the at least one feeding unit has at least two V-shaped feeding grooves for guiding the electronic elements. The unvibrated module includes at least one unvibrated guiding block adjacent to the hollow transparent rotary structure and disposed between the hollow transparent rotary structure and the feeding module, wherein the at least one unvibrated guiding block has at least two V-shaped unvibrated guiding grooves respectively communicated with the at least two V-shaped feeding grooves and respectively corresponding to the at least two annular guiding areas, and the electronic elements on the at least two V-shaped feeding grooves are sequentially transmitted onto the at least two annular guiding areas through the at least two V-shaped unvibrated guiding grooves. The detection module includes a plurality of electronic element detecting units adjacent to the hollow transparent rotary structure, wherein the electronic element detecting units are sequentially disposed around the hollow transparent rotary structure. The classification module is adjacent to the hollow transparent rotary structure and disposed between the feeding module and the last one of the electronic element detecting units.

Furthermore, the multi-track detection system further comprises a correction module including at least two correction units disposed above the hollow transparent rotary structure, wherein each correction unit includes at least two correction elements mated with each other for correcting the position of each electronic element, and the at least two correction elements are separated from each other by a predetermined distance to form an electronic element guiding passage between the at least two correction elements. In addition, the multi-track detection system further comprises a micro-adjusting module including at least two micro-adjusting units disposed above the hollow transparent rotary structure and respectively adjacent to the at least two correction units, wherein the at least two micro-adjusting units respectively positioned beside the two inner sides of the at least two annular guiding areas, and each micro-adjusting unit includes at least one micro-adjusting element contacting the inner side surface of each electronic element for micro-adjusting the position of each electronic element.

One of the embodiments of the instant disclosure provides a multi-track detection system for detecting the appearance of electronic elements, comprising: a rotary module, a feeding module, a correction module, a micro-adjusting module, a detection module, and a classification module. The rotary module includes a rotary base structure and a hollow transparent rotary structure disposed on the rotary base structure, wherein the hollow transparent rotary structure has a bottom surface divided into an inner loop area and an outer loop area around the inner loop area, the inner loop area of the hollow transparent rotary structure is covered by the rotary base structure, the outer loop area of the hollow transparent rotary structure is exposed, the hollow transparent rotary structure has at least two annular guiding areas on the top surface thereof and above the outer loop area, and the electronic elements are sequentially arranged on the at least two annular guiding areas. The feeding module includes at least one feeding unit adjacent to the hollow transparent rotary structure for guiding the electronic elements. The correction module includes at least two correction units adjacent to the feeding module and disposed above the hollow transparent rotary structure, wherein each correction unit includes at least two correction elements mated with each other for correcting the position of each electronic element, and the at least two correction elements are separated from each other by a predetermined distance to form an electronic element guiding passage between the at least two correction elements. The micro-adjusting module includes at least two micro-adjusting units disposed above the hollow transparent rotary structure and respectively adjacent to the at least two correction units, wherein the at least two micro-adjusting units respectively positioned beside the two inner sides of the at least two annular guiding areas, and each micro-adjusting unit includes at least one micro-adjusting element contacting the inner side surface of each electronic element for micro-adjusting the position of each electronic element. The detection module includes a plurality of electronic element detecting units adjacent to the hollow transparent rotary structure, wherein the electronic element detecting units are sequentially disposed around the hollow transparent rotary structure. The classification module is adjacent to the hollow transparent rotary structure and disposed between the feeding module and the last one of the electronic element detecting units.

One of the embodiments of the instant disclosure provides a multi-track detection system for detecting the appearance of electronic elements, comprising: a rotary module, a feeding module, a detection module, and a classification module. The rotary module includes a rotary base structure and a hollow transparent rotary structure disposed on the rotary base structure, wherein the hollow transparent rotary structure has a bottom surface divided into an inner loop area and an outer loop area around the inner loop area, the inner loop area of the hollow transparent rotary structure is covered by the rotary base structure, the outer loop area of the hollow transparent rotary structure is exposed, the hollow transparent rotary structure has at least two annular guiding areas on the top surface thereof and above the outer loop area, and the electronic elements are sequentially arranged on the at least two annular guiding areas. The feeding module includes at least one feeding unit adjacent to the hollow transparent rotary structure for guiding the electronic elements. The detection module includes a plurality of electronic element detecting units adjacent to the hollow transparent rotary structure, wherein the electronic element detecting units are sequentially disposed around the hollow transparent rotary structure, and the electronic elements are detected and classified by the detection module to form a plurality of good electronic elements, bad electronic elements, and retest electronic elements. The classification module is adjacent to the hollow transparent rotary structure and disposed between the feeding module and the last one of the electronic element detecting units, wherein the classification module includes at least one first receiving unit for receiving the good electronic elements, at least one second receiving unit for receiving the bad electronic elements, and at least one third receiving unit for receiving the retest electronic elements, wherein the at least one first receiving unit, the at least one second receiving unit, and the at least one third receiving unit are combined to form a single receiving structure.

Furthermore, the rotary base structure is a non-hollow metal base plate, and the hollow transparent rotary structure is a transparent glass rotary table fixed on the rotary base structure. The hollow transparent rotary structure is divided into a hollow portion, an inner loop portion around the hollow portion, and an outer loop portion around the inner loop portion, the hollow portion of the hollow transparent rotary structure is formed on the rotary base structure to form a receiving space, the inner loop portion of the hollow transparent rotary structure is disposed on the rotary base structure, the outer loop portion of the hollow transparent rotary structure is suspended, and the at least two annular guiding areas are formed on the outer loop portion of the hollow transparent rotary structure. One part of the electronic element detecting units is disposed inside and above the receiving space, and each electronic element detecting unit disposed inside and above the receiving space includes a reflecting mirror and an image capturing lens disposed above the reflecting mirror. The at least one unvibrated guiding block and the at least one feeding unit are separated from each other by a predetermined distance less than the length of each electronic element, and the at least one unvibrated guiding block and the hollow transparent rotary structure are separated from each other by a predetermined distance.

Therefore, the instant disclosure can correctly obtain the appearance of electronic elements by matching the at least two V-shaped feeding grooves and the at least two V-shaped unvibrated guiding grooves. Moreover, each electronic element transmitted from the V-shaped unvibrated guiding groove onto the corresponding annular guiding area can be guided roughly along the electronic element guiding passage between the at least two correction elements, thus each electronic element can be correctly placed on the correct track of the annular guiding area. After each electronic element is roughly guided by the correction unit, each micro-adjusting unit can lightly touch the corresponding electronic element for precisely guiding the corresponding electronic element. Hence, each electronic element can be further correctly placed on the correct track of the annular guiding area. Furthermore, because the electronic element detecting unit is disposed inside and above the receiving space, the positive image of the inner side surface of each electronic element can be correctly captured by matching the reflecting mirror and the image capturing lens. In addition, the good electronic elements can be collected in the same first collection box, the bad electronic elements can be collected in the same second collection box, and the retest electronic elements can be collected in the same third collection box, thus the usage space and the manufacturing cost of the classification module can be reduced.

To further understand the techniques, means and effects the instant disclosure takes for achieving the prescribed objectives, the following detailed descriptions and appended drawings are hereby referred, such that, through which, the purposes, features and aspects of the instant disclosure can be thoroughly and concretely appreciated. However, the appended drawings are provided solely for reference and illustration, without any intention that they be used for limiting the instant disclosure.

DETAILED DESCRIPTION OF THE PREFERRED EMBODIMENTS

Figure 1:
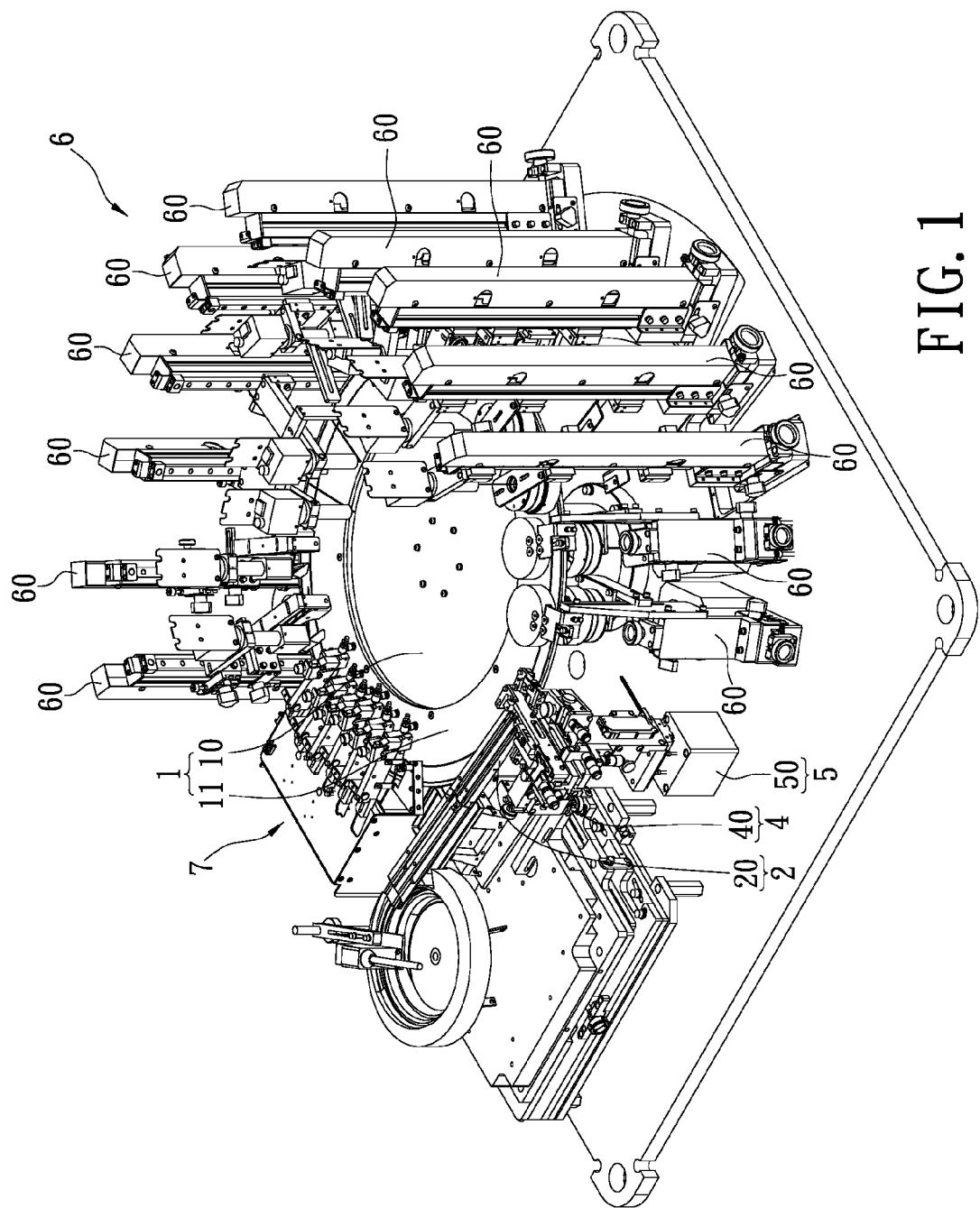
FIG. 1 shows a perspective, schematic view of the multi-track detection system for detecting the appearance of electronic elements according to the instant disclosure.

Referring to FIGS. 1 to 7, the instant disclosure provides a multi-track detection system for detecting the appearance of electronic elements E, comprising: a rotary module 1, a feeding module 2, an unvibrated module 3, a correction module 4, a micro-adjusting module 5, a detection module 6, and a classification module 7.

Referring to FIGS. 1, 2, and 3 again, the rotary module 1 includes a rotary base structure 10 and a hollow transparent rotary structure 11 disposed on the rotary base structure 10. For example, the rotary base structure 10 may be a non-hollow metal base plate, and the hollow transparent rotary structure 11 may be a transparent glass rotary table fixed on the rotary base structure 10 through a plurality of securing elements such as bolts. Because the hollow transparent rotary structure 11 is a hollow structure, the cost of manufacturing the hollow transparent rotary structure 11 can be reduced. In addition, the rotary base structure 10 is secured on a rotation axis (not shown) and the hollow transparent rotary structure 11 is secured on the rotary base structure 10, thus the rotary module 1 can be assembled on or disassembled from the rotation axis by assembling or disassembling the rotary base structure 10 only. In other words, the rotary module 1 can be assembled on or disassembled from the rotation axis without assembling or disassembling the hollow transparent rotary structure 11, thus the usage life of the hollow transparent rotary structure 11 can be increased.

Moreover, the hollow transparent rotary structure 11 has a bottom surface divided into an inner loop area 110 and an outer loop area 111 around the inner loop area 110, the inner loop area 110 of the hollow transparent rotary structure 11 is covered by the rotary base structure 10, and the outer loop area 111 of the hollow transparent rotary structure 11 is exposed outside. The hollow transparent rotary structure 11 has at least two annular guiding areas 11G (as shown in FIGS. 2 and 3) on the top surface thereof and above the outer loop area 111, and the electronic elements E can be sequentially arranged on the at least two annular guiding areas 11G (as shown in FIG. 3).

Furthermore, the hollow transparent rotary structure 11 can be divided into a hollow portion 11A, an inner loop portion 11B around the hollow portion 11A, and an outer loop portion 11C around the inner loop portion 11B. The hollow portion 11A of the hollow transparent rotary structure 11 is formed on the rotary base structure 10 to form a receiving space 11R, the inner loop portion 11B of the hollow transparent rotary structure 11 is disposed on the rotary base structure 10, and the outer loop portion 11C of the hollow transparent rotary structure 11 is suspended. Moreover, the inner loop area 110 of the hollow transparent rotary structure 11 is formed on the bottom surface of the inner loop portion 11B, the outer loop area 111 of the hollow transparent rotary structure 11 is formed on the bottom surface of the outer loop portion 11C, and the at least two annular guiding areas 11G are formed on the top surface of the outer loop portion 11C of the hollow transparent rotary structure 11.

Figure 2:
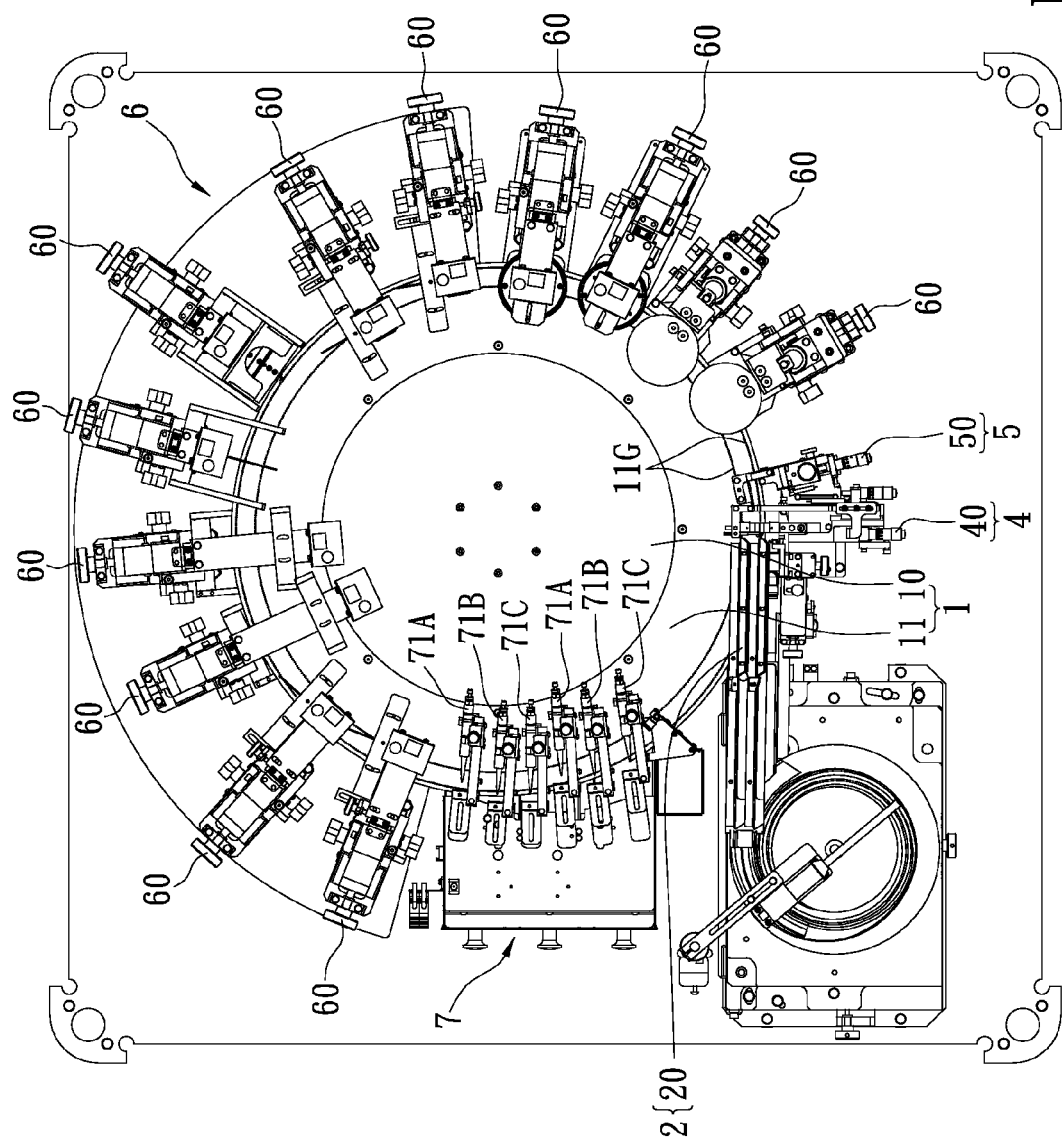
FIG. 2 shows a top, schematic view of the multi-track detection system for detecting the appearance of electronic elements according to the instant disclosure.
Figure 3:
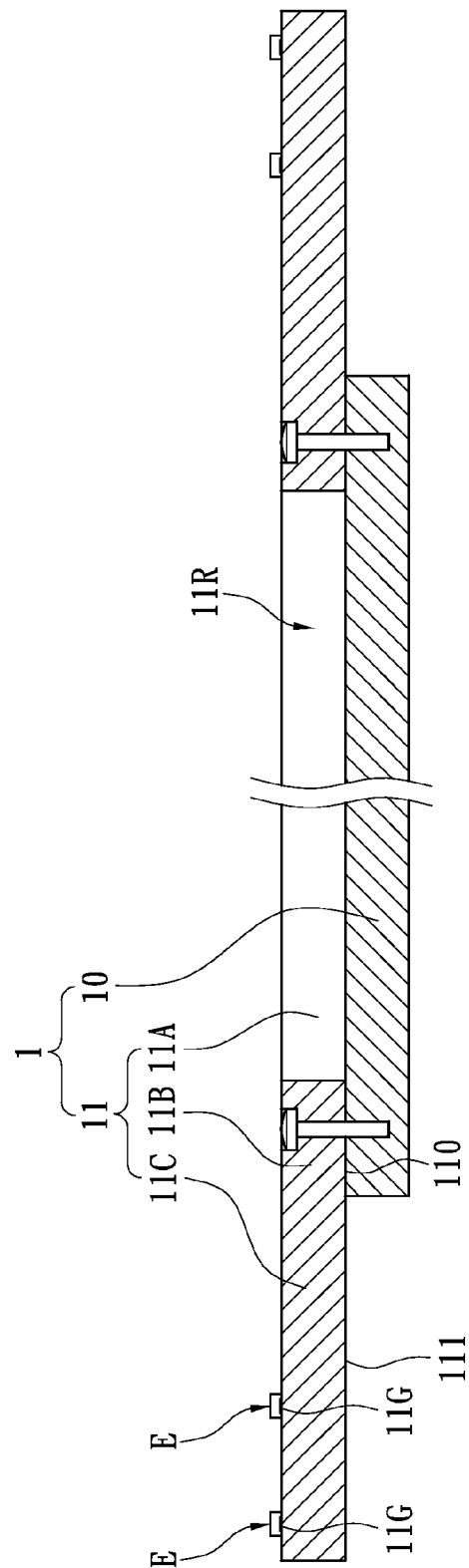
FIG. 3 shows a lateral, cross-sectional, schematic view of the rotary module according to the instant disclosure.
Figure 4:
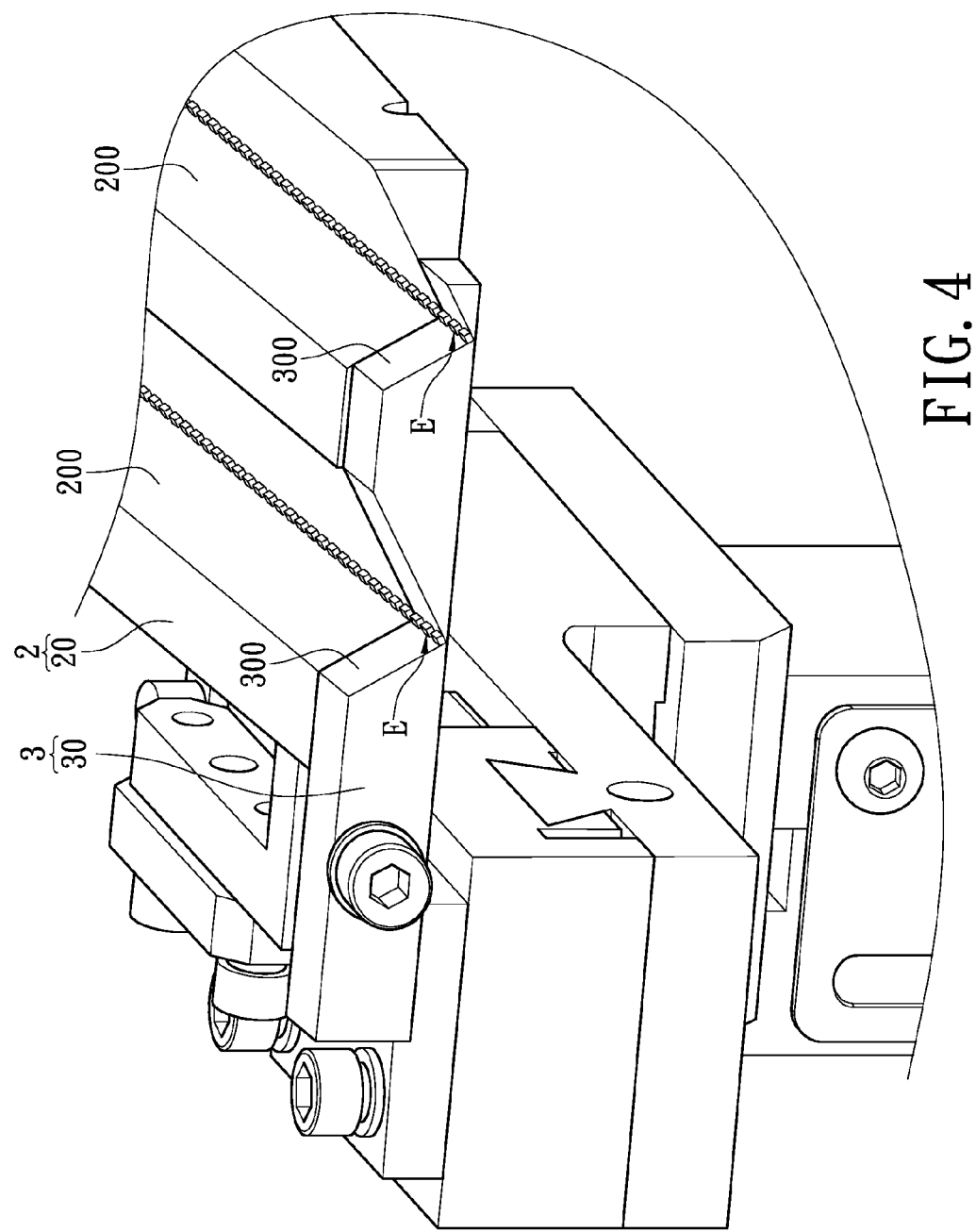
FIG. 4 shows a perspective, schematic view of the feeding module and the unvibrated module according to the instant disclosure.

In addition, referring to FIGS. 1, 2, and 4, the feeding module 2 includes at least one feeding unit 20 adjacent to the hollow transparent rotary structure 11 for guiding the electronic elements E, and the at least one feeding unit 20 has at least two V-shaped feeding grooves 200 for guiding the electronic elements E. For example, the electronic elements E in the at least two V-shaped feeding grooves 200 can be moved frontward by the continuous vibration of the at least one feeding unit 20, thus the electronic elements E cannot be lodged in the at least two V-shaped feeding grooves 200.

Moreover, referring to FIGS. 1, 2, and 4, the unvibrated module 3 includes at least one unvibrated guiding block 30 adjacent to the hollow transparent rotary structure 11 and disposed between the hollow transparent rotary structure 11 and the feeding module 2. In addition, the at least one unvibrated guiding block 30 has at least two V-shaped unvibrated guiding grooves 300 respectively communicated with the at least two V-shaped feeding grooves 200 and respectively corresponding to the at least two annular guiding areas 11G, and the electronic elements E on the at least two V-shaped feeding grooves 200 are sequentially transmitted onto the at least two annular guiding areas 11G through the at least two V-shaped unvibrated guiding grooves 300. Besides, the at least one unvibrated guiding block 30 and the at least one feeding unit 20 are separated from each other by a predetermined distance less than the length of each electronic element E, and the at least one unvibrated guiding block 30 and the hollow transparent rotary structure 11 are separated from each other by a predetermined distance. In other words, because the at least one unvibrated guiding block 30 and the at least one feeding unit 20 are separated from each other by the predetermined distance, the at least one unvibrated guiding block 30 can be held at a smooth and unvibrated state. Thus, each electronic element E can be smoothly and correctly guided from the V-shaped unvibrated guiding groove 300 onto the corresponding annular guiding area 11G.

Figure 5:
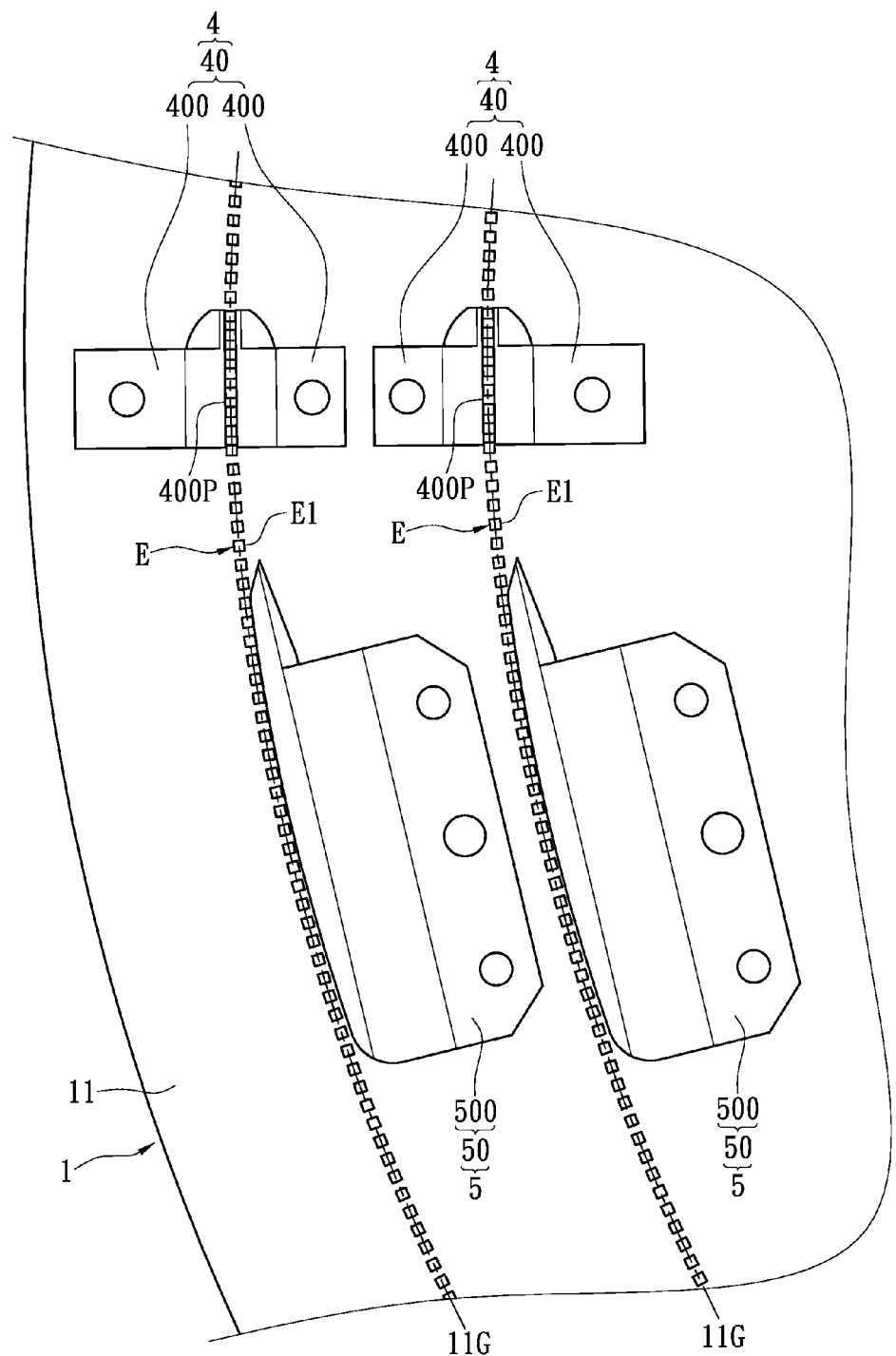
FIG. 5 shows a top, schematic view of the correction module and the micro-adjusting module according to the instant disclosure.

Furthermore, referring to FIGS. 1, 2, and 5, the correction module 4 includes at least two correction units 40 disposed above the hollow transparent rotary structure 11. Each correction unit 40 includes at least two correction elements 400 mated with each other for correcting the position and/or the direction of each electronic element E, and the at least two correction elements 400 are separated from each other by a predetermined distance to form an electronic element guiding passage 400P between the at least two correction elements 400. In other words, each electronic element E transmitted from the V-shaped unvibrated guiding groove 300 onto the corresponding annular guiding area 11G can be guided roughly along the electronic element guiding passage 400P between the at least two correction elements 400, thus each electronic element E can be correctly placed on the correct track of the annular guiding area 11G.

Furthermore, referring to FIGS. 1, 2, and 5, the micro-adjusting module 5 includes at least two micro-adjusting units 50 disposed above the hollow transparent rotary structure 11 and respectively adjacent to the at least two correction units 40. The at least two micro-adjusting units 50 respectively positioned beside the two inner sides of the at least two annular guiding areas 11G, and each micro-adjusting unit 50 includes at least one micro-adjusting element 500 contacting the inner side surface E1 of each electronic element E for micro-adjusting the position and/or the direction of each electronic element E. In other words, after each electronic element E is roughly guided by the correction unit 40, each micro-adjusting unit 50 can lightly touch the corresponding electronic element E for precisely guiding the corresponding electronic element E. Hence, each electronic element E can be further correctly placed on the correct track of the annular guiding area 11G.

Figure 6:
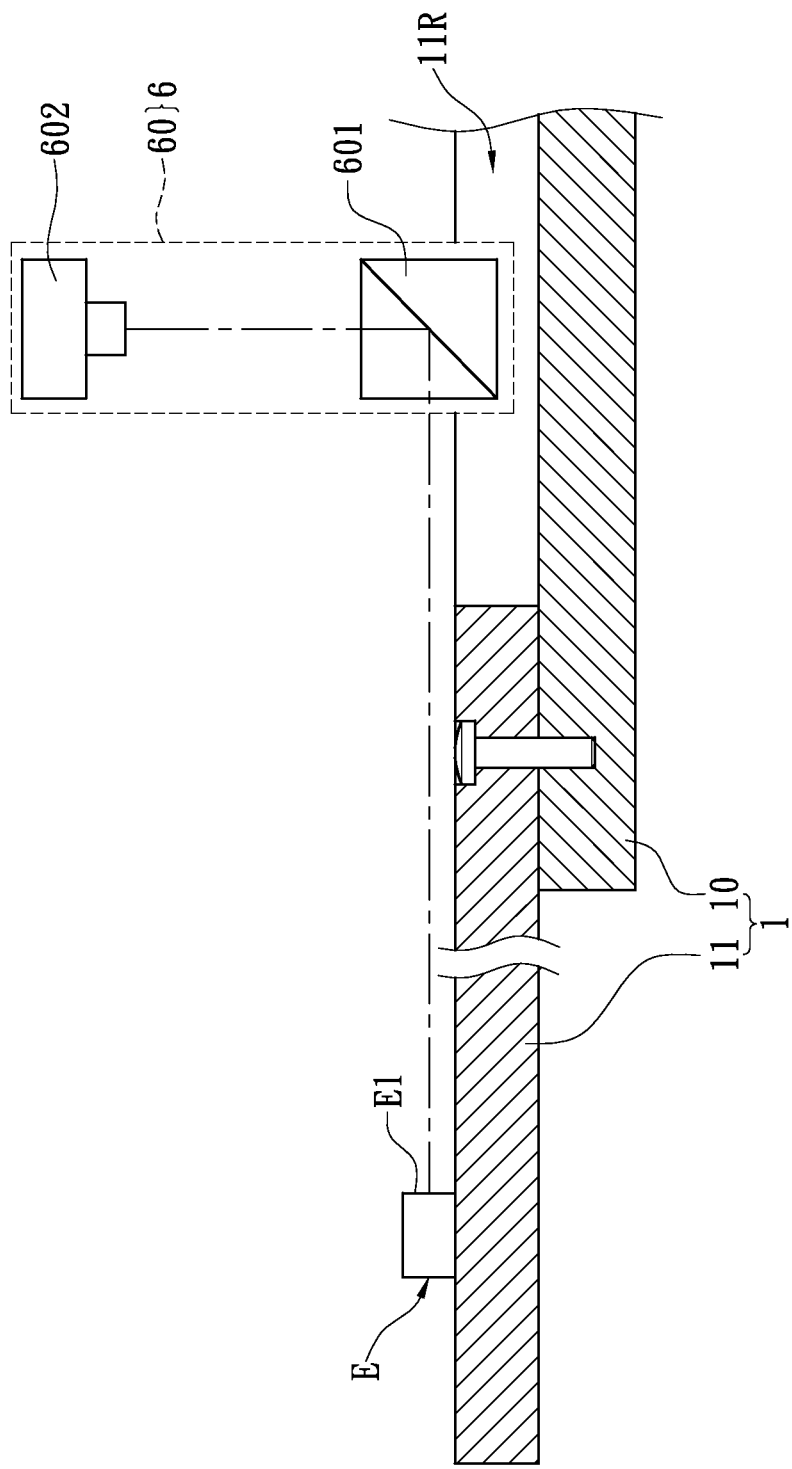
FIG. 6 shows a lateral, cross-sectional, schematic view of one part of one electronic element detecting unit received in the receiving space of the rotary module according to the instant disclosure.

In addition, referring to FIGS. 1, 2, and 6, the detection module 6 includes a plurality of electronic element detecting units 60 adjacent to the hollow transparent rotary structure 11, and the electronic element detecting units 60 are sequentially disposed around the hollow transparent rotary structure 11. For example, the electronic element detecting units 60 surrounds ⅝ periphery of the hollow transparent rotary structure 11. Moreover, one part of the electronic element detecting units 60 is disposed inside and above the receiving space 11R. For example, one of the electronic element detecting units 60 is disposed inside and above the receiving space 11R as shown in FIG. 6. Furthermore, each electronic element detecting unit 60 disposed inside and above the receiving space 11R includes a reflecting mirror 601 and an image capturing lens 602 disposed above the reflecting mirror 601. Because the electronic element detecting unit 60 is disposed inside and above the receiving space 11R, the positive image of the inner side surface E1 of each electronic element E can be correctly captured by matching the reflecting mirror 601 and the image capturing lens 602. For example, referring to FIGS. 1 and 2, there are twelve electronic element detecting units 60, six electronic element detecting units 60 are applied to the electronic elements E on one annular guiding area 11G, and the other six electronic element detecting units 60 are applied to the electronic elements E on the other annular guiding area 11G.

Figure 7:
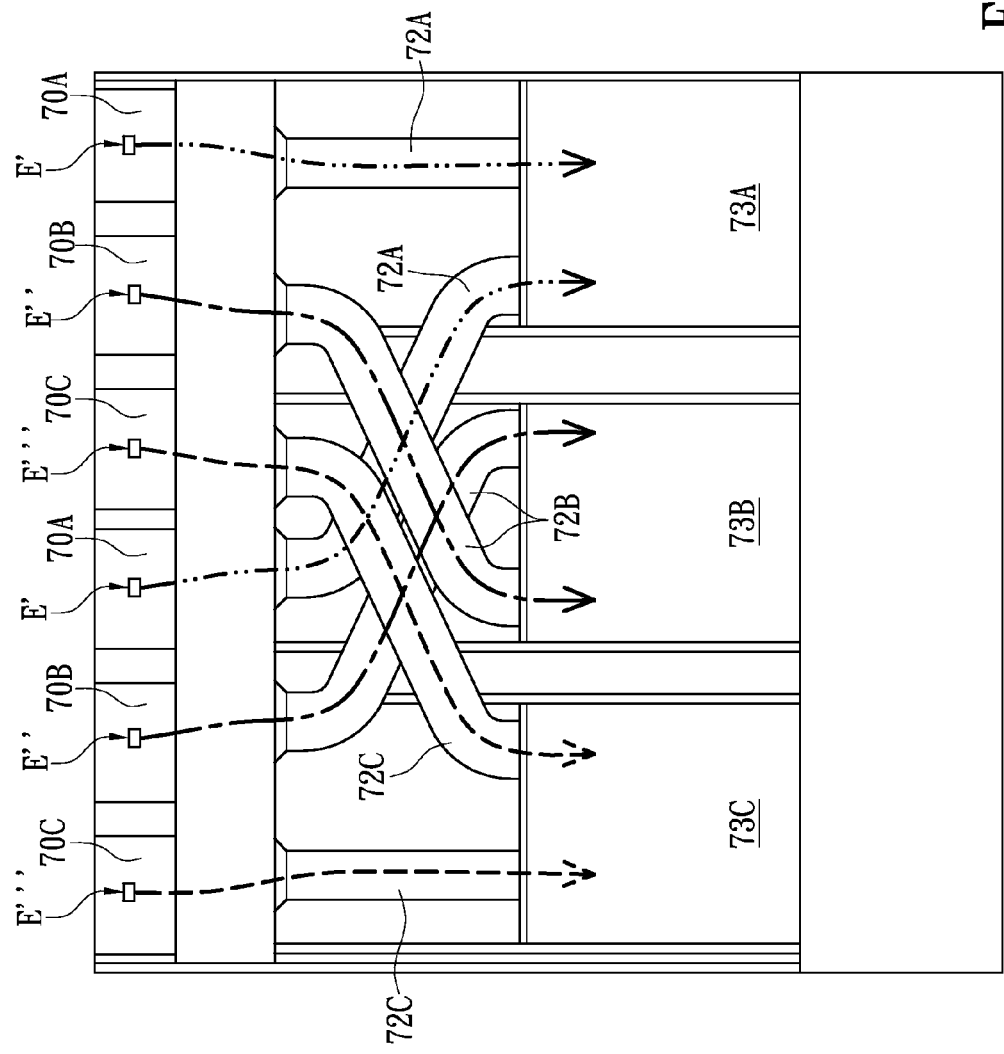
FIG. 7 shows a lateral, schematic view of the classification module according to the instant disclosure.

Moreover, referring to FIGS. 1, 2, and 7, the classification module 7 is adjacent to the hollow transparent rotary structure 11 and disposed between the feeding module 2 and the last one of the electronic element detecting units 60. In addition, the electronic elements E are detected and classified by the detection module 6 to form a plurality of good electronic elements E', bad electronic elements E", and retest electronic elements E'". The classification module 7 includes at least one first receiving unit 7A for receiving the good electronic elements E', at least one second receiving unit 7B for receiving the bad electronic elements E", and at least one third receiving unit 7C for receiving the retest electronic elements E'". The at least one first receiving unit 7A, the at least one second receiving unit 7B, and the at least one third receiving unit 7C are combined to form a single receiving structure, thus the at least one first receiving unit 7A, the at least one second receiving unit 7B, and the at least one third receiving unit 7C are not three independent receiving structures.

For example, referring to FIGS. 2 and 7, the at least one first receiving unit 7A includes at least two first classifying inlets 70A, at least two first nozzles 71A (as shown in FIG. 2) disposed above the hollow transparent rotary structure 11 for blowing the good electronic elements E' from the at least two annular guiding areas 11G into the at least two first classifying inlets 70A, at least two first transportation pipes 72A respectively communicated with the at least two first classifying inlets 70A, and at least one first collection box 73A communicated with the at least two first transportation pipes 72A. In addition, the at least one second receiving unit 7B includes at least two second classifying inlets 70B, at least two second nozzles 71B (as shown in FIG. 2) disposed above the hollow transparent rotary structure 11 for blowing the bad electronic elements E" from the at least two annular guiding areas 11G into the at least two second classifying inlets 70B, at least two second transportation pipes 72B respectively communicated with the at least two second classifying inlets 70B, and at least one second collection box 73B communicated with the at least two second transportation pipes 72B. Moreover, the at least one third receiving unit 7C includes at least two third classifying inlets 70C, at least two third nozzles 71C (as shown in FIG. 2) disposed above the hollow transparent rotary structure 11 for blowing the retest electronic elements E'" from the at least two annular guiding areas 11G into the at least two third classifying inlets 70C, at least two third transportation pipes 72C respectively communicated with the at least two third classifying inlets 70C, and at least one third collection box 73C communicated with the at least two third transportation pipes 72C.

Therefore, the good electronic elements E' on the at least two annular guiding areas 11G can be collected in the same first collection box 73A through the at least two first transportation pipes 72A along the paths of the two chain lines as shown in FIG. 7, the bad electronic elements E" on the at least two annular guiding areas 11G can be collected in the same second collection box 73B through the at least two second transportation pipes 72B along the paths of the two center lines as shown in FIG. 7, and the retest electronic elements E'" on the at least two annular guiding areas 11G can be collected in the same third collection box 73C through the at least two third transportation pipes 72C along the paths of the two broken lines as shown in FIG. 7, thus the usage space and the manufacturing cost of the classification module 7 can be reduced.

In conclusion, the instant disclosure can correctly obtain the appearance of electronic elements by matching the at least two V-shaped feeding grooves and the at least two V-shaped unvibrated guiding grooves. Moreover, each electronic element transmitted from the V-shaped unvibrated guiding groove onto the corresponding annular guiding area can be guided roughly along the electronic element guiding passage between the at least two correction elements, thus each electronic element can be correctly placed on the correct track of the annular guiding area. After each electronic element is roughly guided by the correction unit, each micro-adjusting unit can lightly touch the corresponding electronic element for precisely guiding the corresponding electronic element. Hence, each electronic element can be further correctly placed on the correct track of the annular guiding area. Furthermore, because the electronic element detecting unit is disposed inside and above the receiving space, the positive image of the inner side surface of each electronic element can be correctly captured by matching the reflecting mirror and the image capturing lens. In addition, the good electronic elements can be collected in the same first collection box, the bad electronic elements can be collected in the same second collection box, and the retest electronic elements can be collected in the same third collection box, thus the usage space and the manufacturing cost of the classification module can be reduced.

The above-mentioned descriptions merely represent the preferred embodiments of the instant disclosure, without any intention or ability to limit the scope of the instant disclosure which is fully described only within the following claims. Various equivalent changes, alterations or modifications based on the claims of instant disclosure are all, consequently, viewed as being embraced by the scope of the instant disclosure.

What is claimed is:

1. A multi-track detection system for detecting the appearance of electronic elements, comprising:
    a rotary module including a rotary base structure and a hollow transparent rotary structure disposed on the rotary base structure, wherein the hollow transparent rotary structure has a bottom surface divided into an inner loop area and an outer loop area around the inner loop area, the inner loop area of the hollow transparent rotary structure is covered by the rotary base structure, the outer loop area of the hollow transparent rotary structure is exposed, the hollow transparent rotary structure has at least two annular guiding areas on the top surface thereof and above the outer loop area, and the electronic elements are sequentially arranged on the at least two annular guiding areas;
    a feeding module including at least one feeding unit adjacent to the hollow transparent rotary structure, wherein the at least one feeding unit has at least two V-shaped feeding grooves for guiding the electronic elements;
    an unvibrated module including at least one unvibrated guiding block adjacent to the hollow transparent rotary structure and disposed between the hollow transparent rotary structure and the feeding module, wherein the at least one unvibrated guiding block has at least two V-shaped unvibrated guiding grooves respectively communicated with the at least two V-shaped feeding grooves and respectively corresponding to the at least two annular guiding areas, and the electronic elements on the at least two V-shaped feeding grooves are sequentially transmitted onto the at least two annular guiding areas through the at least two V-shaped unvibrated guiding grooves;
a detection module including a plurality of electronic element detecting units adjacent to the hollow transparent rotary structure, wherein the electronic element detecting units are sequentially disposed around the hollow transparent rotary structure; and
a classification module adjacent to the hollow transparent rotary structure and disposed between the feeding module and the last one of the electronic element detecting units.

2. The multi-track detection system as claimed in claim 1, wherein the rotary base structure is a non-hollow metal base plate, and the hollow transparent rotary structure is a transparent glass rotary table fixed on the rotary base structure.

3. The multi-track detection system as claimed in claim 1, wherein the hollow transparent rotary structure is divided into a hollow portion, an inner loop portion around the hollow portion, and an outer loop portion around the inner loop portion, the hollow portion of the hollow transparent rotary structure is formed on the rotary base structure to form a receiving space, the inner loop portion of the hollow transparent rotary structure is disposed on the rotary base structure, the outer loop portion of the hollow transparent rotary structure is suspended, and the at least two annular guiding areas are formed on the outer loop portion of the hollow transparent rotary structure.

4. The multi-track detection system as claimed in claim 3, wherein one part of the electronic element detecting units is disposed inside and above the receiving space, and each electronic element detecting unit disposed inside and above the receiving space includes a reflecting mirror and an image capturing lens disposed above the reflecting mirror.

5. The multi-track detection system as claimed in claim 1, wherein the at least one unvibrated guiding block and the at least one feeding unit are separated from each other by a predetermined distance less than the length of each electronic element, and the at least one unvibrated guiding block and the hollow transparent rotary structure are separated from each other by a predetermined distance.

6. The multi-track detection system as claimed in claim 1, wherein the electronic elements are detected and classified by the detection module to form a plurality of good electronic elements, bad electronic elements, and retest electronic elements, and the classification module includes at least one first receiving unit for receiving the good electronic elements, at least one second receiving unit for receiving the bad electronic elements, and at least one third receiving unit for receiving the retest electronic elements.

7. The multi-track detection system as claimed in claim 6, wherein the at least one first receiving unit includes at least two first classifying inlets, at least two first nozzles disposed above the hollow transparent rotary structure for blowing the good electronic elements from the at least two annular guiding areas into the at least two first classifying inlets, at least two first transportation pipes respectively communicated with the at least two first classifying inlets, and at least one first collection box communicated with the at least two first transportation pipes.

8. The multi-track detection system as claimed in claim 6, wherein the at least one second receiving unit includes at least two second classifying inlets, at least two second nozzles disposed above the hollow transparent rotary structure for blowing the bad electronic elements from the at least two annular guiding areas into the at least two second classifying inlets, at least two second transportation pipes respectively communicated with the at least two second classifying inlets, and at least one second collection box communicated with the at least two second transportation pipes.

9. The multi-track detection system as claimed in claim 6, wherein the at least one third receiving unit includes at least two third classifying inlets, at least two third nozzles disposed above the hollow transparent rotary structure for blowing the retest electronic elements from the at least two annular guiding areas into the at least two third classifying inlets, at least two third transportation pipes respectively communicated with the at least two third classifying inlets, and at least one third collection box communicated with the at least two third transportation pipes.

10. The multi-track detection system as claimed in claim 1, further comprising a correction module including at least two correction units disposed above the hollow transparent rotary structure, wherein each correction unit includes at least two correction elements mated with each other for correcting the position of each electronic element, and the at least two correction elements are separated from each other by a predetermined distance to form an electronic element guiding passage between the at least two correction elements.

11. The multi-track detection system as claimed in claim 10, further comprising: a micro-adjusting module including at least two micro-adjusting units disposed above the hollow transparent rotary structure and respectively adjacent to the at least two correction units, wherein the at least two micro-adjusting units respectively positioned beside the two inner sides of the at least two annular guiding areas, and each micro-adjusting unit includes at least one micro-adjusting element contacting the inner side surface of each electronic element for micro-adjusting the position of each electronic element.

12. A multi-track detection system for detecting the appearance of electronic elements, comprising:
a rotary module including a rotary base structure and a hollow transparent rotary structure disposed on the rotary base structure, wherein the hollow transparent rotary structure has a bottom surface divided into an inner loop area and an outer loop area around the inner loop area, the inner loop area of the hollow transparent rotary structure is covered by the rotary base structure, the outer loop area of the hollow transparent rotary structure is exposed, the hollow transparent rotary structure has at least two annular guiding areas on the top surface thereof and above the outer loop area, and the electronic elements are sequentially arranged on the at least two annular guiding areas;
a feeding module including at least one feeding unit adjacent to the hollow transparent rotary structure for guiding the electronic elements;
a correction module including at least two correction units adjacent to the feeding module and disposed above the hollow transparent rotary structure, wherein each correction unit includes at least two correction elements mated with each other for correcting the position of each electronic element, and the at least two correction elements are separated from each other by a predetermined distance to form an electronic element guiding passage between the at least two correction elements;
a micro-adjusting module including at least two micro-adjusting units disposed above the hollow transparent rotary structure and respectively adjacent to the at least two correction units, wherein the at least two micro-adjusting units respectively positioned beside the two inner sides of the at least two annular guiding areas, and each micro-adjusting unit includes at least one micro-adjusting element contacting the inner side surface of each electronic element for micro-adjusting the position of each electronic element;

a detection module including a plurality of electronic element detecting units adjacent to the hollow transparent rotary structure, wherein the electronic element detecting units are sequentially disposed around the hollow transparent rotary structure; and a classification module adjacent to the hollow transparent rotary structure and disposed between the feeding module and the last one of the electronic element detecting units.

13. A multi-track detection system for detecting the appearance of electronic elements, comprising:

a rotary module including a rotary base structure and a hollow transparent rotary structure disposed on the rotary base structure, wherein the hollow transparent rotary structure has a bottom surface divided into an inner loop area and an outer loop area around the inner loop area, the inner loop area of the hollow transparent rotary structure is covered by the rotary base structure, the outer loop area of the hollow transparent rotary structure is exposed, the hollow transparent rotary structure has at least two annular guiding areas on the top surface thereof and above the outer loop area, and the electronic elements are sequentially arranged on the at least two annular guiding areas;

a feeding module including at least one feeding unit adjacent to the hollow transparent rotary structure for guiding the electronic elements;

a detection module including a plurality of electronic element detecting units adjacent to the hollow transparent rotary structure, wherein the electronic element detecting units are sequentially disposed around the hollow transparent rotary structure, and the electronic elements are detected and classified by the detection module to form a plurality of good electronic elements, bad electronic elements, and retest electronic elements; and a classification module adjacent to the hollow transparent rotary structure and disposed between the feeding module and the last one of the electronic element detecting units, wherein the classification module includes at least one first receiving unit for receiving the good electronic elements, at least one second receiving unit for receiving the bad electronic elements, and at least one third receiving unit for receiving the retest electronic elements, wherein the at least one first receiving unit, the at least one second receiving unit, and the at least one third receiving unit are combined to form a single receiving structure.

14. The multi-track detection system as claimed in claim 13, wherein the rotary base structure is a non-hollow metal base plate, and the hollow transparent rotary structure is a transparent glass rotary table fixed on the rotary base structure.

15. The multi-track detection system as claimed in claim 13, wherein the hollow transparent rotary structure is divided into a hollow portion, an inner loop portion around the hollow portion, and an outer loop portion around the inner loop portion, the hollow portion of the hollow transparent rotary structure is formed on the rotary base structure to form a receiving space, the inner loop portion of the hollow transparent rotary structure is disposed on the rotary base structure, the outer loop portion of the hollow transparent rotary structure is suspended, and the at least two annular guiding areas are formed on the outer loop portion of the hollow transparent rotary structure.

16. The multi-track detection system as claimed in claim 15, wherein one part of the electronic element detecting units is disposed inside and above the receiving space, and each electronic element detecting unit disposed inside and above the receiving space includes a reflecting mirror and an image capturing lens disposed above the reflecting mirror.

17. The multi-track detection system as claimed in claim 13, wherein the at least one unvibrated guiding block and the at least one feeding unit are separated from each other by a predetermined distance less than the length of each electronic element, and the at least one unvibrated guiding block and the hollow transparent rotary structure are separated from each other by a predetermined distance.

18. The multi-track detection system as claimed in claim 13, wherein the electronic elements are detected and classified by the detection module to form a plurality of good electronic elements, bad electronic elements, and retest electronic elements, and the classification module includes at least one first receiving unit for receiving the good electronic elements, at least one second receiving unit for receiving the bad electronic elements, and at least one third receiving unit for receiving the retest electronic elements.

* * * * *